(12) United States Patent
Lee et al.

(10) Patent No.: US 10,868,280 B2
(45) Date of Patent: Dec. 15, 2020

(54) ORGANIC LIGHT-EMITTING DISPLAY DEVICE

(71) Applicant: Samsung Display Co., Ltd., Yongin-si (KR)

(72) Inventors: Dongki Lee, Yongin-si (KR); Hyeonbum Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 54 days.

(21) Appl. No.: 16/242,232

(22) Filed: Jan. 8, 2019

(65) Prior Publication Data
US 2019/0221767 A1 Jul. 18, 2019

(30) Foreign Application Priority Data
Jan. 17, 2018 (KR) ........................ 10-2018-0006191

(51) Int. Cl.
| | | |
|---|---|---|
| H01L 27/146 | (2006.01) | |
| H01L 21/00 | (2006.01) | |
| H01L 51/52 | (2006.01) | |
| H01L 27/32 | (2006.01) | |
| H01L 31/0216 | (2014.01) | |
| H01J 9/227 | (2006.01) | |
| H01L 29/786 | (2006.01) | |
| H01J 11/44 | (2012.01) | |

(52) U.S. Cl.
CPC ........ *H01L 51/5284* (2013.01); *H01J 9/2278* (2013.01); *H01J 11/44* (2013.01); *H01L 27/3272* (2013.01); *H01L 29/78633* (2013.01); *H01L 31/02164* (2013.01); *H01L 51/5265* (2013.01); *H01L 51/5271* (2013.01)

(58) Field of Classification Search
CPC .......... H01L 27/3272; H01L 29/78633; H01L 31/02164; H01L 51/5284
USPC ............................. 438/69–72; 257/435, 436
See application file for complete search history.

(56) References Cited

U.S. PATENT DOCUMENTS

| | | | | |
|---|---|---|---|---|
| 6,445,005 B1 * | 9/2002 | Yamazaki | ............. | H01L 27/322 257/72 |
| 8,253,322 B2 * | 8/2012 | Lee | ..................... | H01L 51/5284 313/504 |
| 8,629,472 B2 * | 1/2014 | Seo | .......................... | F21L 4/08 257/98 |

(Continued)

FOREIGN PATENT DOCUMENTS

| KR | 10-2016-0130071 A | 11/2016 |
|---|---|---|
| KR | 10-2016-0140089 A | 12/2016 |

(Continued)

*Primary Examiner* — Calvin Lee
(74) *Attorney, Agent, or Firm* — Kile Park Reed & Houtteman PLLC

(57) ABSTRACT

An organic light-emitting display device includes a pixel electrode, an emission layer on the pixel electrode, an opposing electrode covering the emission layer, a plurality of upper layers on the opposing electrode, light-shielding elements on the upper layers, and a color filter layer on the upper layers. The light-shielding elements include first light-shielding layers and second light-shielding layers. The first light-shielding layers include first materials, and the second light-shielding layers include second materials different from the first materials. The second light-shielding layers overlay the first light-shielding layers.

14 Claims, 6 Drawing Sheets

(56) References Cited

U.S. PATENT DOCUMENTS

| | | | |
|---|---|---|---|
| 9,673,263 B2 | 6/2017 | Ono et al. | |
| 9,859,354 B2 | 1/2018 | Kang et al. | |
| 10,263,061 B2 * | 4/2019 | Negishi | H01L 27/3272 |
| 2016/0351631 A1 | 12/2016 | Lee | |
| 2017/0092889 A1 | 3/2017 | Seo et al. | |
| 2019/0348470 A1 * | 11/2019 | Song | H01L 27/322 |

FOREIGN PATENT DOCUMENTS

| | | |
|---|---|---|
| KR | 10-1699191 B1 | 1/2017 |
| KR | 10-2017-0038681 A | 4/2017 |

\* cited by examiner

ORGANIC LIGHT-EMITTING DISPLAY DEVICE

CROSS-REFERENCE TO RELATED APPLICATION

Korean Patent Application No. 10-2018-0006191, filed on Jan. 17, 2018, in the Korean Intellectual Property Office, and entitled: "Organic Light-Emitting Display Device," is incorporated by reference herein in its entirety.

BACKGROUND

1. Field

One or more embodiments relate to an organic light-emitting display device, and more particularly, to an organic light-emitting display device having an improved ratio of viewing angle to luminance.

2. Description of the Related Art

Organic light-emitting display devices include hole injection electrodes, electron injection electrodes, and organic light-emitting elements that include organic emission layers formed between the hole injection electrodes and the electron injection electrodes. The organic light-emitting display devices are self-emission display devices in which holes injected from the hole injection electrodes and electrons injected from the electron injection electrode are combined at the organic emission layers, and excitons generated by this combination fall from an excited state to a ground state and emit light.

Regarding such organic light-emitting display devices, research has been conducted to realize flexible display devices such as foldable display devices and rollable display devices.

SUMMARY

Embodiments are directed to an organic light-emitting display device, including a pixel electrode, an emission layer on the pixel electrode, an opposing electrode covering the emission layer, a plurality of upper layers on the opposing electrode, light-shielding elements on the upper layers, and a color filter layer on the upper layers. The light-shielding elements include first light-shielding layers and second light-shielding layers. The first light-shielding layers include first materials, and the second light-shielding layers include second materials different from the first materials, the second light-shielding layers overlying the first light-shielding layers.

The first materials may be or include metal materials.

The second materials may be or include organic materials.

The second light-shielding layers may directly contact the first light-shielding layers.

Widths of the second light-shielding layers may be greater than widths of the first light-shielding layers.

The organic light-emitting display device may further include a pixel defining layer covering edges of the pixel electrode such that a center area of the pixel electrode is exposed, the upper layers may correspond to the pixel electrode and the pixel defining layer.

A light-emitting area of the emission layer may correspond to an area of the pixel electrode not covered by the pixel defining layer.

A first distance between one of the first light-shielding layers and another one of the first light-shielding layers adjacent thereto may be greater than a width of the light-emitting area.

Ends of edges of the second light-shielding layers may be between ends of edges of the first light-shielding layers and ends of edges of the pixel defining layer.

Ends of the edges of the second light-shielding layers and ends of the edges of the first light-shielding layers may be on a same surface.

A thickness of the second light-shielding layers may be greater than a thickness of the first light-shielding layers.

A thickness of the first light-shielding layer is in a range of from about 200 Å to about 500 Å.

Embodiments are also directed to an organic light-emitting display device including a pixel electrode, an emission layer on the pixel electrode, an opposing electrode covering the emission layer, a plurality of upper layers on the opposing electrode, light-shielding elements on the upper layers, and a color filter layer on the upper layers. Each of the light-shielding elements may include a first light-shielding layer including first materials, the first materials being metal materials.

A thickness of the first light-shielding layer may be in a range of from about 200 Å to about 500 Å.

The organic light-emitting display device may further include a pixel defining layer covering edges of the pixel electrode such that a center area of the pixel electrode is exposed. The upper layers correspond to the pixel electrode and the pixel defining layer. A light-emitting area of the emission layer corresponds to an area of the pixel electrode not covered by the pixel defining layer.

A first distance between one of the first light-shielding layers and another one of the first light-shielding layers may be greater than a width of the light-emitting area.

Embodiments are also directed to an organic light-emitting display device including a pixel electrode, an emission layer on the pixel electrode, an opposing electrode covering the emission layer, a plurality of upper layers on the opposing electrode, light-shielding elements on the upper layers, and a color filter layer on the upper layers. Each of the light-shielding elements includes a first light-shielding layer including first materials and a second light-shielding layer including second materials different from the first materials, the second light-shielding layer overlying the first light-shielding layer. The first materials are or include organic materials, and the second materials are or include metal materials.

A width of the second light-shielding layers may be greater than a width of the first light-shielding layers.

The second light-shielding layers may directly contact the first light-shielding layers.

A thickness of the first light-shielding layers may be greater than a thickness of the second light-shielding layers.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
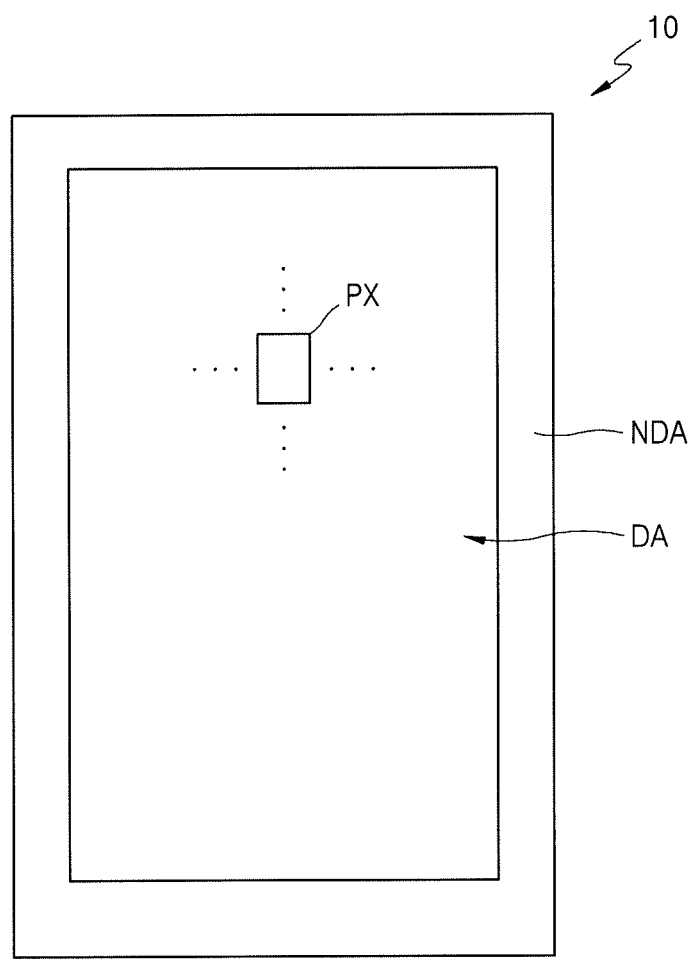
FIG. 1 illustrates a top-plan view schematically showing an organic light-emitting display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a top-plan view schematically showing an organic light-emitting display device according to an embodiment.

Referring to FIG. 1, the organic light-emitting display device may include a display area DA configured to display images and a non-display area NDA adjacent to the display area DA. The display area DA may include a plurality of pixel areas PX A pixel emitting a predetermined amount of light may be formed in each pixel area PX. Images may be provided by light emitted by the pixels included in the display area DA.

The non-display area NDA may surround the display area DA and include a scanning driver and a data driver configured to transmit a certain signal to the pixels included in the display area DA.

Although a case in which the non-display area NDA surrounds the display area DA is shown in FIG. 1 in some implementations, the non-display area NDA may be in a part of the display area DA to reduce a dead area, which is an area where images are not displayed.

Figure 2:
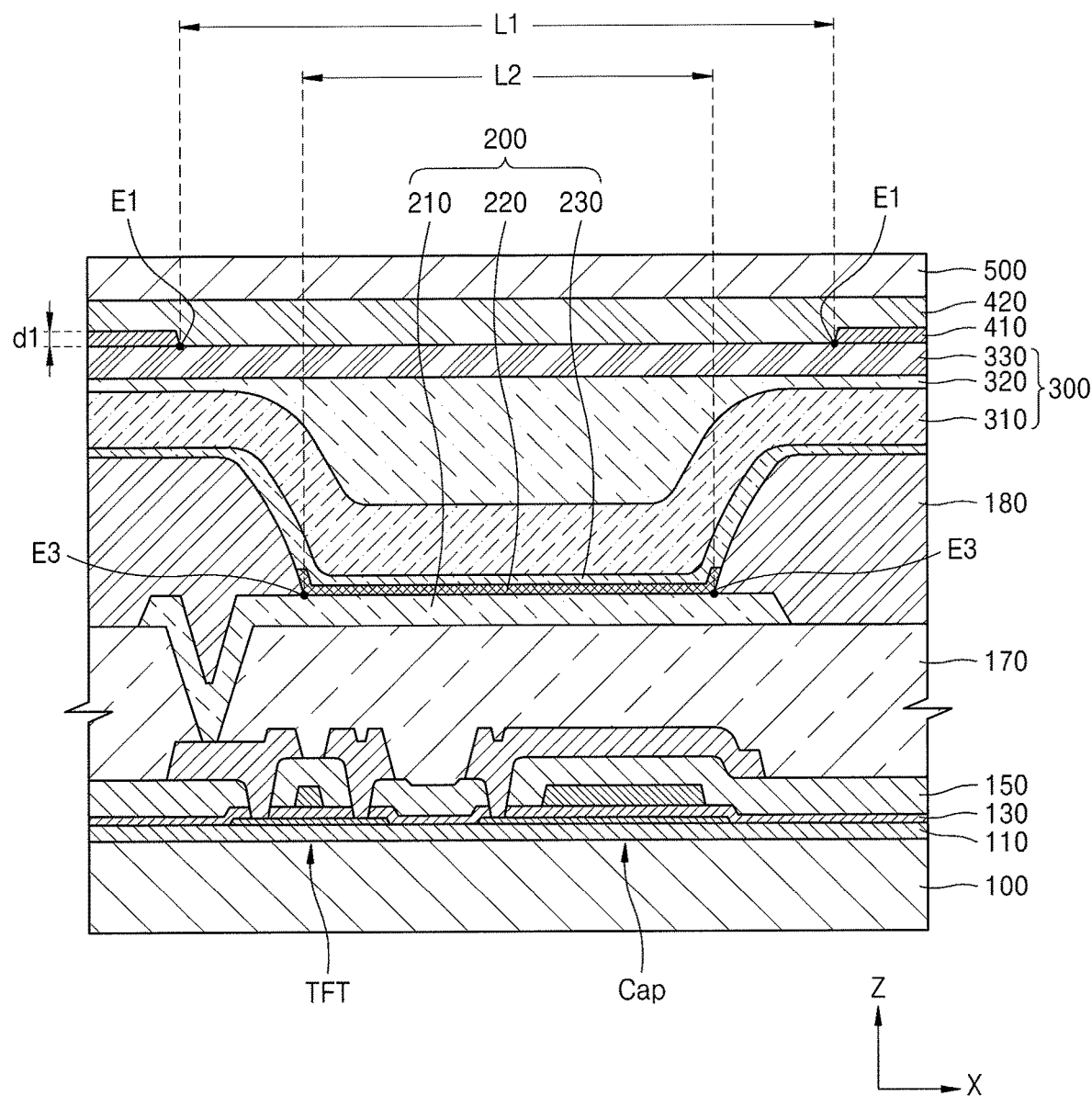
FIG. 2 illustrates a cross-sectional view schematically showing a part of the organic light-emitting display device according to an embodiment.

FIG. 2 illustrates a cross-sectional view schematically showing a part of the organic light-emitting display device according to an embodiment.

The organic light-emitting display device may include a pixel electrode 210, an emission layer 220 on the pixel electrode 210, four upper layers 230, 310, 320, and 330 on the emission layer 220, light-shielding elements 410 on the upper layers 230, 310, 320, and 330, the light-shielding elements 410 on the light-shielding elements 410 being patterned so as to not overlay the emission layer 220, and a color filter layer 420 overlaid above the emission layer 220 and on the upper layers 230, 310, 320, and 330.

As illustrated in FIG. 2, a thin film transistor TFT or a capacitor Cap may be provided on a substrate 100, and the pixel electrode 210 may be electrically connected to the thin film transistor TFT. The substrate 100 may also be electrically connected to the thin film transistor TFT. The substrate 100 may be formed of a suitable material such as including glass, metal, or plastic. For example, the substrate may include a plastic such as polyethylene terephthalate (PET), polyethylene naphthalate (PEN), or polyimide. On the substrate 100, there may be provided: a buffer layer 110 that prevents impurities from permeating into a semiconductor layer of the thin film transistor TFT; a gate dielectric 130 configured to insulate the semiconductor layer of the thin film transistor TFT and a gate electrode; an interlayer dielectric 150 configured to insulate a source electrode and a drain electrode of the thin film transistor TFT and the gate electrode; and a planarization film 170 that covers the thin film transistor TFT and has an upper surface that is flattened.

The pixel electrode 210 may be a transparent or semi-transparent electrode or may be a reflective electrode. When the pixel electrode is a transparent or semi-transparent, the pixel electrode 210 may contain, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 210 is a reflective electrode, the pixel electrode 210 may include a reflecting film containing Ag, Mg, Al, Pt, Pd, Au, Ni, Nd, Ir, Cr, or combinations thereof, and a film containing ITO, IZO, ZnO, or $In_2O_3$.

The pixel defining layer 180 may be provided on an upper surface of the pixel electrode 210 to define an area on which the emission layer is to be provided, as illustrated in FIG. 2. The pixel defining layer 180 may cover edges of the pixel electrode 210 such that a center area of the pixel electrode 210 is exposed. In this configuration, the pixel defining layer 180 may define pixels. The pixel defining layers 180 may prevent arcs from occurring on ends of the pixel electrode 210 by increasing a distance between ends of the pixel electrode 180 and an opposing electrode 230 above the pixel electrode 210, The emission layer 220 may be provided on the pixel electrode 210. In some implementations, another interlayer may be provided between the pixel electrode 210 and the emission layer 220. For example, a hole injection layer and/or a hole transport layer (HTL) may be provided on the pixel electrode 210, and the emission layer 220 may be on the hole injection layer and/or the hole transport layer.

As illustrated in FIG. 2, the opposing electrode 230 may be provided on the emission layer 220. The opposing electrode 230 may be with a common electrode with regard to a plurality of pixels. Accordingly, the opposing electrode 230 may correspond not only to the emission layer 220 but also to an upper portion of the pixel defining layer 180. The opposing electrode 230 may be a transparent or semi-transparent electrode. To this end, the opposing electrode 230 may include a layer containing Li, Ca, LiF/Ca, LiF/Al, Al, and Mg or combinations thereof, and a layer containing a transparent or semi-transparent material such as ITO, IZO, ZnO, or $In_2O_3$.

The pixel electrode 210, the emission layer 220, and the opposing electrode 230 may form an organic light-emitting diode 200. The organic light-emitting diode 200 may emit light having a luminance that is determined based on electric signals applied to the pixel electrode 210 through the thin film transistor TFT.

Encapsulation layers 300 may be provided on the organic light-emitting diode 200. The encapsulation layers 300 may correspond not only to a portion on the organic light-emitting device 200 but also to a portion above the pixel defining layer 180. The encapsulation layers 300 may have a multi-layer structure. In FIG. 2, the encapsulation layers 300 are illustrated as including a first inorganic layer 310, an organic encapsulation layer 320, and a second inorganic encapsulation layer 330. The encapsulation layers 300 may help to protect the organic light-emitting diode 200 from impurities such as oxygen or moisture from outside.

The first inorganic encapsulation layer 310 or the second inorganic encapsulation layer 330 may contain various materials, for example, silicon nitride and/or silicon oxide, metal oxide, metal nitride, metal oxynitride, or metal carbonate. An organic encapsulation layer 320 between the first inorganic encapsulation layer 310 and the second inorganic encapsulation layer 330 may flatten a curved shape of the first inorganic encapsulation layer 310. In addition, even if cracks were to occur in the first inorganic encapsulation layer 310, when the organic encapsulation layer 320 covers the first inorganic encapsulation layer 310, cracks in the first inorganic encapsulation layer 310 may not extend to the second inorganic encapsulation layer 330. The organic encapsulation layer 320 may include at least one of polyethylene terephthalate, polyethylene naphthalate, polycarbonate, polyimide, polyethylene sulfonate, polyoxymethylene, and polyarylate.

The light-shielding elements 410 and the color filter layer 420 may be provided on the encapsulation layers 300. The light-shielding elements 410 may provided on the encapsulation layers 300 so as to not overlap the emission layer. The color filter layer 420 may be provided on the capsulation layers 300 to overlay the emission layer 220. The light-shielding elements 410, which do not overlap the emission layer 220, may be understood to be located between the pixels. For example, when the organic light-emitting display device is viewed on a Z axis, which is perpendicular to an XY plane, the light-shielding elements 410 may have a pattern of circumnavigating each of the pixels. The light-shielding elements 410 may circumnavigate the light-emitting area of the emission layer 220.

The light-shielding elements 410 may prevent reflection of external lights and improve a contrast of the display device. The light-shielding elements 410 may include the first light-shielding layers containing the first materials. The first materials may be metal materials. For example, the first material may include materials such as MoTaOx, Mo, Al, Ti. In some implementations, the first light-shielding layers of the light-shielding elements 410 may have a bilayer structure. In the bilayer structure, an upper layer may include one of MoTaOx, Mo, Al, Ti. and a lower layer may include one of Ti/Al/Ti, Mo, and Al.

Figure 3:
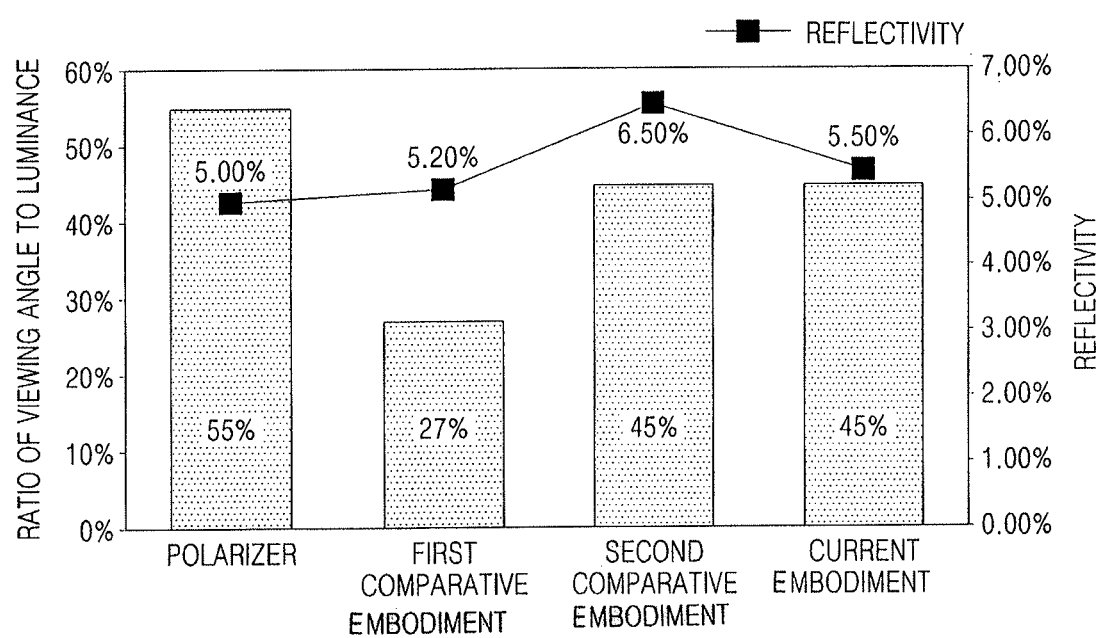
FIG. 3 illustrates a graph showing comparison results with regard to ratios of viewing angles to luminance and reflectivities in the case of the organic light-emitting display device of FIG. 2 and organic light-emitting display devices of comparative embodiments.

FIG. 3 illustrates a graph showing a result of comparing ratios of viewing angles to luminance and reflectivities in the organic light-emitting display device of FIG. 2 and in organic light-emitting display devices according to comparative embodiments. Here, a first comparative embodiment is an organic light-emitting display device where light-shielding elements are formed of organic materials and a distance between adjacent light-shielding elements is equal to a width of a light-emitting area. A second comparative embodiment is an organic light-emitting display device in a case light-shielding elements are formed of organic materials and a distance between adjacent light-shielding elements is greater than a width of a light-emitting area.

Referring to FIG. 3, a reflectivity in the first comparative embodiment shown to be equal to a reflectivity (approximately 5%) in an embodiment where a polarizer is used. However, a ratio of viewing angle to luminance is shown to be significantly less (approximately 27%) than a ratio of viewing angle to luminance (approximately 55%) in the embodiment where the polarizer is used. In a second comparative embodiment, by making a distance between the light-shielding elements greater than width of the light-emitting area, a ratio of viewing angle to luminance may be greater than the ratio of viewing angle and luminance in the first comparative embodiment. However, a reflectivity herein may be greater than the reflectivity in the first comparative embodiment. For example, the reflectivity and ratios of viewing angles to luminance are shown to be in a trade off relationship.

In the organic light-emitting display device according to an embodiment, the light-shielding elements may include the first light-shielding elements containing metal materials. The light-shielding elements may secure an equal level of reflectivity with a smaller thickness than that of light-shielding elements containing only organic materials. In the organic light-emitting display device according to an embodiment, due to a decrease in thicknesses of the light-shielding element, a decrease in bias, for example, a decrease from about 3.4 μm to about 1.9 μm, may be observed. Accordingly, it may be observed that the ratio of viewing angle to the luminance according to the current embodiment is equal to that of the second comparative embodiment, while reflectivity characteristics are improved. In this case, the bias may relate to a distance between the light-shielding element 410 and the pixel defining layer 180, that is, a distance between an edge of the light-shielding element 410 and an edge of the pixel defining layer 180.

Referring again to FIG. 2, in an embodiment, the first thickness d1 of the first light-shielding layers maybe in a range of from about 200 Å to about 500 Å. When the first thickness d1 of the first light-shielding layers is more than 200 Å, an increase in reflectivity may be avoided low reflection may be implemented. In an experimental embodiment, in which the first light-shielding layers contain MoTaOx, when the first thicknesses are 450 Å, reflectivity is 4.42%, however, when the first thickness d1 150 Å, reflectivity increases to 6.03%. In addition, when the first thickness d1 of the first light-shielding layers is less than 500 Å, a decrease in side visibility due to increase in a thickness on a Z axis and a decrease in the ratio of viewing angle to luminance may be avoided. Accordingly, the first thicknesses d1 of the first light-shielding layers may be in the range of from about 200 Å to about 500 Å.

A distance L1 between one of the light-shielding elements 410 and another one of the light-shielding elements 410 may be greater than a width L3 of the light-emitting area. For example, the distance L3 between ends E3s of edges of the pixel defining layer 180 defining the light-emitting area may be less than the distance L1 between ends E1s of edges of the light-shielding elements 410. Accordingly, an angle at which light generated from the light-emitting area of the organic light-emitting display device is emitted may be enlarged, and the organic light-emitting display device may have an improved ratio of viewing angle to luminance.

The light-shielding elements 410 and the color filter layer 420 may be located on the encapsulation layers 300. Accordingly, lower surfaces of the light-shielding elements 410 in a direction of the emission layer 220 (−z direction) and a lower surface of the color filter layer in the direction of the emission layer 220 (−z direction) may be located on a same surface. A thickness of the color filter layer 420 may be greater than the thicknesses of the light-shielding element 410, as illustrated in FIG. 1. Accordingly, the color filter layer 420 may cover upper surfaces of the light-shielding elements 410. In some implementations, the thickness of the color filter layer 420 may be identical to the thicknesses of the light-shielding elements 410.

The organic light-emitting display device according to the embodiment may further include a window 500. The window 500 may be a permeable layer provided on an outermost area of the display device.

Figure 4:
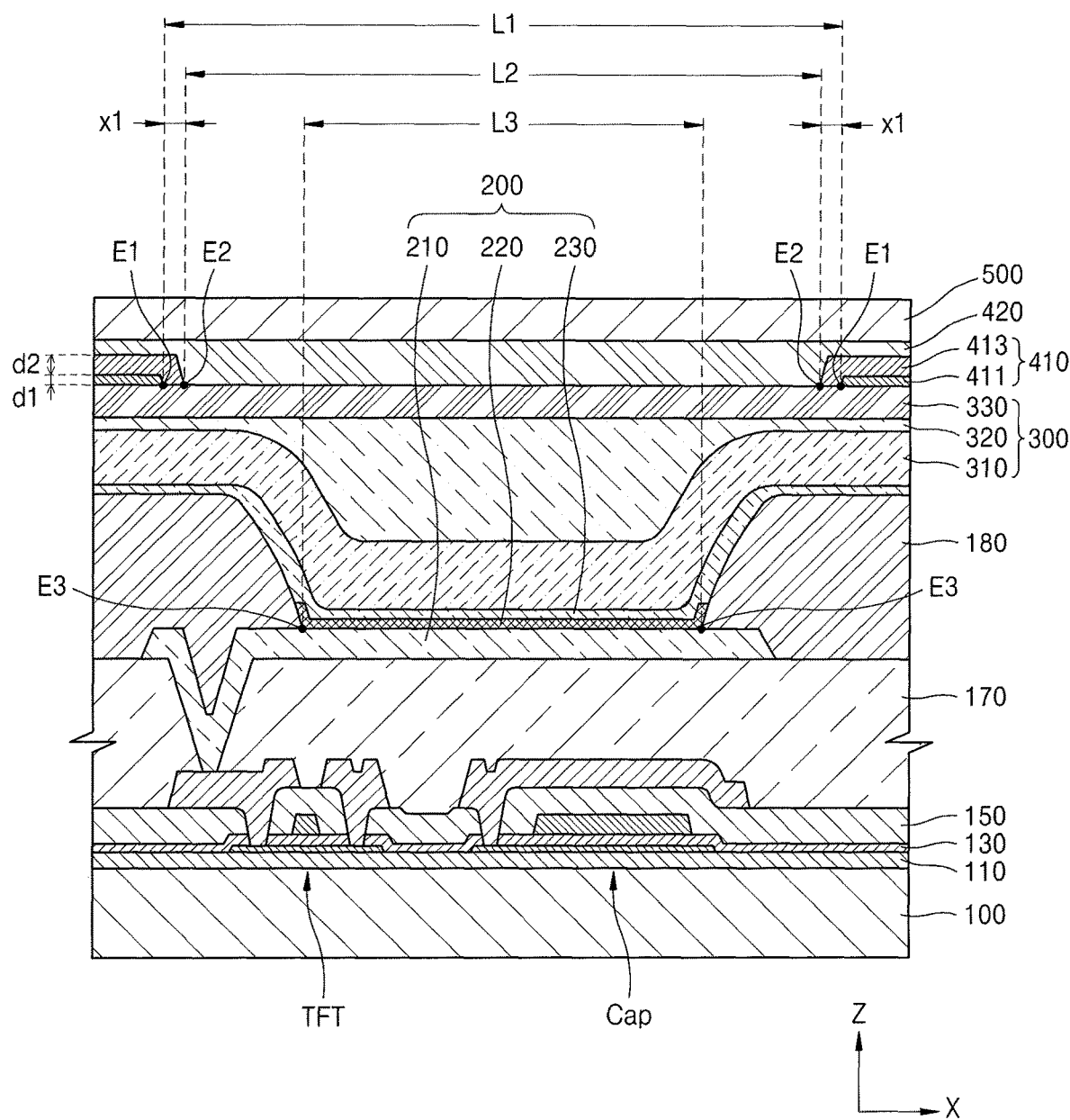
FIGS. 4 through 6 illustrate cross-sectional views showing an organic light-emitting display device according to other embodiments.
Figure 5:
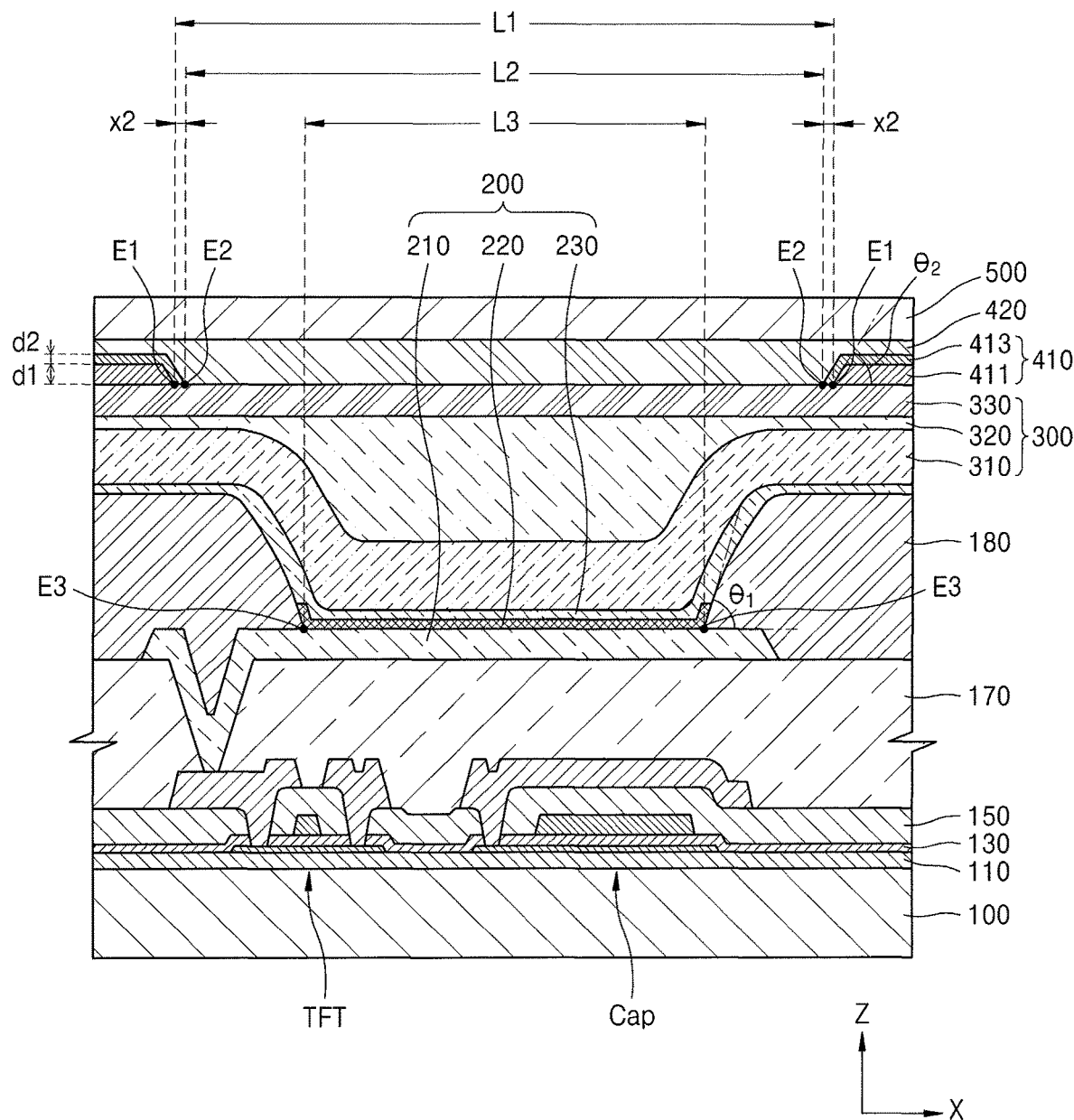
Figure 6:
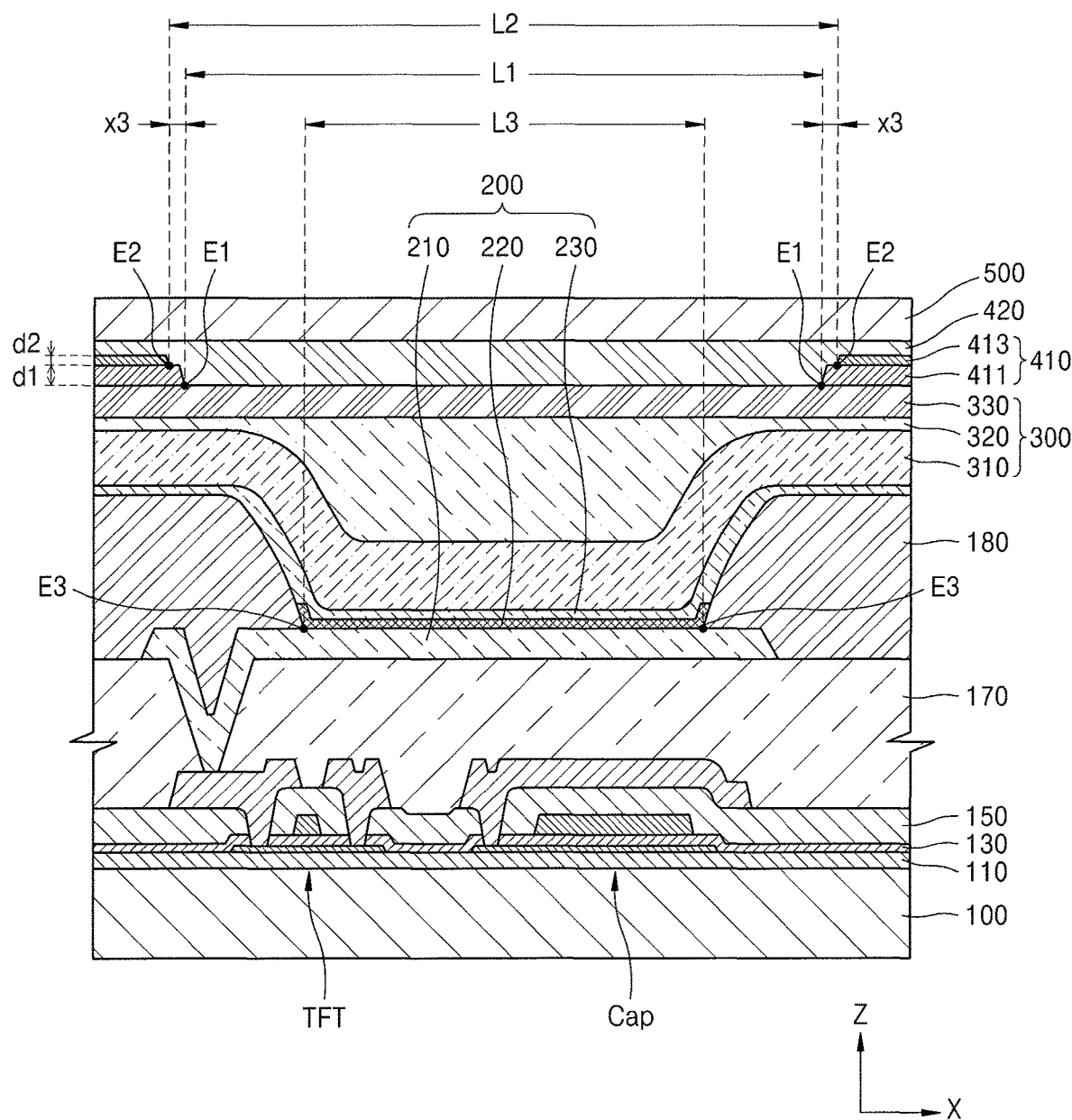

FIGS. 4 through 6 illustrate cross-sectional views of organic light-emitting display devices according to embodiments. In the organic light-emitting display devices in FIGS. 4 through 6, components other than the structure of the light-shielding elements may be identical to the structure of the organic light-emitting display device of FIG. 2. Accordingly, for convenience of description, like reference numerals are given to like elements, and descriptions are like elements are not repeated.

Referring to FIGS. 4 through 6, a organic light-emitting display device according to an embodiment may include the pixel electrode 210, the emission layer 220 on the pixel electrode 210, the four upper layers 230, 310, 320, and 330 on the emission layer 220, the light-shielding elements 410 on the upper layers 230, 310, 320, and 330, such that the light shielding elements 410 do not overlap the emission layer 220, and the color filter layer 420 overlays the emission layer 220, the color lifter layer 420 being on the upper layers 230, 310, 320, and 330.

The light-shielding elements 410 may respectively include a first light-shielding layer 411 and a second light-shielding layer 413. The first light-shielding layers 411 may contain first materials, and the second light-shielding layer 413 may contain second materials different from the first materials. The second light-shielding layers may overlay the first light-shielding layers 411. The second light-shielding layers 413 may directly contact the first light-shielding layers 411.

As an embodiment, the first materials may include metal materials, and the second materials may include organic materials. For example, the first materials may include materials such as MoTaOx, Mo, Al, or Ti. The second materials may include pigments such as carbon black, and may also contain an organic material having photo-sensitivity. The organic material may be a high-molecular organic substance made by one, or a combination of at least two, of polyacrylate, polystyrene, and polyethylene.

The thickness of the first light-shielding layers 411 (first thickness d1) may be less than thickness of the second light-shielding layers 413 (second thickness d2). In this case, the first thickness d1 of the first light-shielding layers 411 may have values in a range of from about 200 Å to about 500 Å. As described above, when the first thickness d1 of the first light-shielding layers is less than 200 Å, it may be difficult to implement low reflection due to an increase in reflectivity, and when the first thickness d1 of the first light-shielding layers is greater than 500 Å, side visibility may decrease due to an increase in the thicknesses on the Z axis. Accordingly, the ratio of viewing angle to luminance may be decreased. Accordingly, when the first thickness d1 of the first light-shielding layers 411 are in a range of from about 200 Å to about 500 Å, reflectivity may be reduced and a suitable ratio of viewing angle to luminance may be secured.

The second thickness d2 of the second light-shielding layers 413 may have values in a range of from about 1.0 μm to about 1.5 μm. The second light-shielding layers 413 may contain carbon black having an optical density (OD) of from about 1.0 to about 2.0. In the light-shielding elements containing organic materials in the comparative embodiment, if the light-shielding elements were to contain a large amount of carbon black, for example, equal to or greater than OD 4.0, parts of films included in the light-shielding elements could be left in the light-emitting during patterning, and thus, light emission could be reduced. If the light-shielding elements were to be made of organic materials containing carbon black, a content of the carbon black would be decreased, and thus, the light-shielding feature would inevitably be weakened. However, the light-shielding element 410 according to an embodiment may be formed into a bilayer structure including the first light-shielding layers 411 containing metal materials and the second light-shielding layers 413 containing organic materials. Accordingly, the light-shielding feature may be maintained by the first light-shielding layers 411, and thus, a content of carbon black in the second light-shielding layers 413 may be decreased.

Widths of the second light-shielding layers 413 may be greater than widths of the first light-shielding layers 411. For example, the second light-shielding layers 413 may cover upper surfaces of the first light-shielding layer, and ends E2 of edges of the second light-shielding layers 413 may be located on a same surface with ends E1 of edges of the first light-shielding layers 411. A distance x1 between the end E2 of the edge of the second light-shielding layer 413 and the end E1 of the edge of the first light-shielding layer 411, as illustrated in FIG. 4, may be in a range of from about 0.8 μm to about 1.2 μm. Also, a distance L2 between one of the second light-shielding layers 413 and another one of the second light-shielding layers 413 may be less than a distance L1 between the first light-shielding layers 411.

Each of the light-shielding elements 410 according to an embodiment may be formed into a bilayer structure of the first light-shielding layer 411, containing metal materials, and the second light-shielding layer 413, containing organic materials. The first light-shielding layer 411 may substantially perform a light-shielding function. In this case, by forming a distance L1 between the first light-shielding layers 411 to be greater than a width L3 of the light-emitting area, an angle at which the light is emitted from the light-emitting area gets out may be increased. Thus, the ratio of viewing angle to luminance may be increased. A distance L2 between the second light-shielding layers 413 may be equal to or greater than the width L3 of the light-emitting area. For example, the end E2 of the edge of the second light-shielding layer 413 may be located between the end E1 of the edge of the first light-shielding layer 411 and an end E3 of an edge of the pixel defining layer 180.

According to an embodiment illustrated in FIG. 5, the first material may contain organic materials, and the second material may contain metal materials. For example, the first material may contain pigments such as carbon black, and may also contain organic materials having photo-sensitivity. In this case, the organic material may be a high-molecular organic substance formed by one of, or a combination of at least two of, polyacrylate, polystyrene, and polyethylene. The second materials may contain materials such as MoTaOx, Mo, Al, Ti.

In this embodiment, the thickness of the first light-shielding layer 411 (first thickness d1) may be greater than the thickness of the second light-shielding layer 413 (second thickness d2). The first thickness d1 of the first light-shielding layer 411 may be in a range of from about 1.0 μm to about 1.5 μm, and the second thickness d2 of the second light-shielding layer 413 may be in a range of from about 200 Å to about 500 Å. The second light-shielding layer 413 including metal materials may be formed on the first light-shielding layer 411 such that the width of the second light-shielding layer 413 is wider than the width of the first light-shielding layer 411. Accordingly, additional residue errors, which could occur due to the first light-shielding layer 411 including organic materials, may be suppressed. In this case, a distance x2 between the end E1 of the edge of the first light-shielding layer 411 and the end E2 of the edge of the second light-shielding layer 413 may be determined by a second thickness d2 of the second light-shielding layer 413.

The light-shielding elements 410 of FIG. 5 may form a cone angle θ2 at the end E1 of the edge of the first light-shielding layer 411 that is smaller than a cone angle θ1 at the end E3 of the edge of the pixel defining layer 180. In the light-shielding elements 410, the second light-shielding layers 413 may be formed on the first light-shielding layers. Accordingly, the second light-shielding layers 413, which perform a light-shielding function, may be located on a higher position. Accordingly, a ratio of viewing angle to luminance of the light-shielding elements 410 of FIG. 5 could be less than the ratio of viewing angle to luminance of the light-shielding elements 410 of FIG. 4. To prevent decrease in the ratio of viewing angle to luminance, by forming the cone angle θ2 of the first light-shielding layers 411 to be smaller than the cone angle θ1, side visibility may be increased.

According to an embodiment illustrated in FIG. 6, when the first materials contain organic materials and the second materials contain metal materials, the width of the second light-shielding layer 413 may be less than the width of the first light-shielding layer 411. In this case, the ends E1 of the edges of the first light-shielding layers 411 may be located between the ends E2 of the edges of the second light-shielding layers 413 and the ends E3 of the edges of the pixel defining layers 180. Although edge surfaces of the second light-shielding layer 413 may be formed to extend from edge surfaces of the first light-shielding layer 411, as illustrated in FIG. 6, the ends E2 of the edges of the second light-shielding layers 413 may be formed to have a certain distance x3 from the ends E1 of the edges of the first light-shielding layers 411. Like in the embodiment of FIG. 5, the second light-shielding layers 413 may be formed on the first light-shielding layers 411 of the light-shielding elements. Accordingly, the second light-shielding layers 413, which perform the light-shielding function, may be located at a higher position. A ratio of viewing angle to luminance of the light-shielding elements 410 of FIG. 6 could be less than the ratio of viewing angle to luminance of the light-shielding elements 410 of FIG. 4. To prevent decrease in the ratio of viewing angle to luminance, the ends E2 of the edges of the second light-shielding layers 413 may be arranged to be separated by a certain distance x3 from the ends E1 of the edges of the first light-shielding layers 411. Accordingly, side visibility of the light-shielding element 410 may be improved.

By way of summation and review, organic light-emitting display devices do not need extra light sources, may be driven by low voltages, and may have a lightweight thin structure. Also, due to their excellent features such as viewing angle, contrast, and response speed, organic light-emitting display devices have been widely used for personal portable devices, such as MP3 players or mobile phones, televisions (TVs), etc. Regarding such organic light-emitting display devices, research has been conducted to provide flexible display devices such as foldable display devices and rollable display devices Although polarizers may be used in organic light-emitting display devices to increase visibility, polarizers may be unsuitable for flexible display devices and may reduce light efficiencies due to low penetration.

Embodiments provide an organic light-emitting display device that has improved ratios of viewing angles to luminance.

As described above, the organic light-emitting display device according to the embodiments may, by including the light-shielding elements containing the metal materials, reduce reflectivity while having improved ratios of viewing angles to luminance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting display device, comprising:
a pixel electrode;
an emission layer on the pixel electrode;
an opposing electrode covering the emission layer;
a plurality of upper layers on the opposing electrode;
light-shielding elements on the upper layers; and
a color filter layer on the upper layers,
wherein:
each of the light-shielding elements includes a first light-shielding layer including first materials and a second light-shielding layer including second materials different from the first materials,
the first materials are or include organic materials,
the second materials are or include metal materials, and
a first thickness of the first light-shielding layers is greater than a second thickness of the second light-shielding layers, the second thickness being in a range of from 200 Å to 500 Å.

2. The organic light-emitting display device as claimed in claim 1, wherein:
a width of the second light-shielding layers is greater than a width of the first light-shielding layers.

3. The organic light-emitting display device as claimed in claim 1, wherein:
the second light-shielding layers directly contact the first light-shielding layers.

4. An organic light-emitting display device, comprising:
a pixel electrode;
an emission layer on the pixel electrode;
an opposing electrode covering the emission layer;
a plurality of upper layers on the opposing electrode;
light-shielding elements on the upper layers; and
a color filter layer on the upper layers,
wherein:
the light-shielding elements include first light-shielding layers and second light-shielding layers,
the first light-shielding layers include first materials,
the second light-shielding layers include second materials different from the first materials, the second light-shielding layers overlying the first light-shielding layers, and widths of the second light-shielding layers are greater than widths of the first light-shielding layers, the second light-shielding layers are farther from the pixel electrode than the first light-shielding layers.

5. The organic light-emitting display device as claimed in claim 4, wherein:
the ends of edges of the second light-shielding layers and the ends of edges of the first light-shielding layers are on a same surface.

6. The organic light-emitting display device as claimed in claim 4, wherein:
a thickness of the second light-shielding layers is greater than a thickness of the first light-shielding layers.

7. The organic light-emitting display device as claimed in claim 4, wherein:
a thickness of the first light-shielding layer is in a range of from about 200 Å to about 500 Å.

8. The organic light-emitting display device as claimed in claim 4, wherein:
the second light-shielding layers directly contact the first light-shielding layers.

9. The organic light-emitting display device as claimed in claim 4, wherein:
the first materials are or include metal materials.

10. The organic light-emitting display device as claimed in claim 9, wherein:
the second materials are or include organic materials.

11. The organic light-emitting display device as claimed in claim 4, further comprising:
a pixel defining layer covering edges of the pixel electrode such that a center area of the pixel electrode is exposed,
wherein the upper layers correspond to the pixel electrode and the pixel defining layer.

12. The organic light-emitting display device as claimed in claim 11, wherein:
ends of edges of the second light-shielding layers are between ends of edges of the first light-shielding layers and ends of edges of the pixel defining layer.

13. The organic light-emitting display device as claimed in claim 11, wherein:
a light-emitting area of the emission layer corresponds to an area of the pixel electrode not covered by the pixel defining layer.

14. The organic light-emitting display device as claimed in claim 13, wherein:
a first distance between one of the first light-shielding layers and another one of the first light-shielding layers adjacent thereto is greater than a width of the light-emitting area.

* * * * *